United States Patent
Chou et al.

(10) Patent No.: US 6,171,895 B1
(45) Date of Patent: *Jan. 9, 2001

(54) FABRICATION OF BURIED CHANNEL DEVICES WITH SHALLOW JUNCTION DEPTH

(75) Inventors: Jih-Wen Chou, Hsin-Chu; Shih-Wei Sun, Taipei, both of (TW)

(73) Assignee: United Microelectronics Corp., Hsin-Chu (TW)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/173,547

(22) Filed: Oct. 16, 1998

Related U.S. Application Data

(62) Division of application No. 08/751,238, filed on Nov. 18, 1996, now Pat. No. 5,864,163.
(60) Provisional application No. 60/009,053, filed on Dec. 27, 1995.

(51) Int. Cl.$^7$ .................................... H01L 21/8238
(52) U.S. Cl. .................... 438/217; 438/276; 438/289; 438/290; 438/291
(58) Field of Search ................... 438/217, 275, 438/276, 289, 290, 291, FOR 25; 148/DIG. 26

(56) References Cited

U.S. PATENT DOCUMENTS

| | | | |
|---|---|---|---|
| 4,902,639 | * | 2/1990 | Ford . |
| 4,948,745 | * | 8/1990 | Pfiester et al. . |
| 5,047,812 | * | 9/1991 | Pfiester . |
| 5,073,512 | * | 12/1991 | Yoshino . |
| 5,177,028 | * | 1/1993 | Manning . |
| 5,317,534 | * | 5/1994 | Choi et al. ............................. 365/182 |
| 5,614,430 | * | 3/1997 | Liang et al. . |
| 5,674,762 | * | 10/1997 | See et al. . |
| 5,864,163 | * | 1/1999 | Chou et al. ............................. 257/385 |
| 5,908,791 | * | 6/1999 | Han et al. ............................. 438/738 |

\* cited by examiner

*Primary Examiner*—Long Pham
(74) *Attorney, Agent, or Firm*—Rabin & Champagne, P.C.

(57) ABSTRACT

The channel doping profile of a PMOS field effect transistor consists of a shallow distribution of a P-type dopant as a threshold adjust implant, a deeper distribution of an N-type dopant as an buried channel stop implant and a still deeper implantation of an N-type dopant as an antipunchthrough implant. A junction is formed between the P-type threshold adjust implant and the N-type buried channel stop implant at a relatively shallow depth so that the depth of the buried channel region is limited by the buried channel stop implant, reducing the short channel effect. The channel doping profile is formed so that diffsion of impurities from the channel region to the gate oxide is prevented. The buried channel stop implant is made first through a sacrificial oxide layer. The sacrificial oxide is etched and a gate oxide layer and a thin film of polysilicon are deposited on the surface of the gate oxide. Both the threshold implant and the antipunchthrough implant are made through the thin polysilicon layer and the gate oxide layer. After the channel doping profile is defined, additional gate material is deposited and device construction is completed in the normal manner.

14 Claims, 4 Drawing Sheets

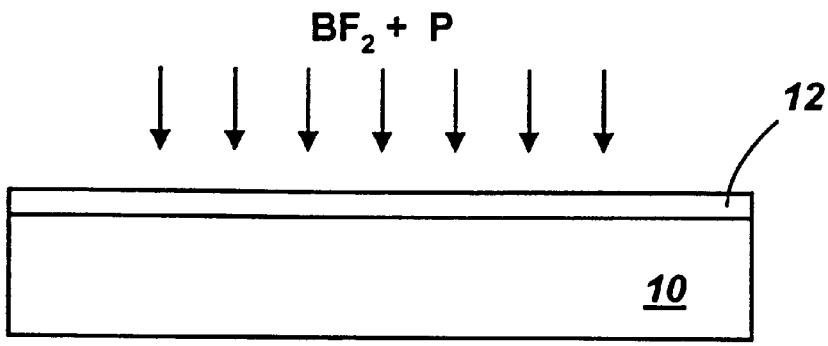
FIG. 1 -- PRIOR ART
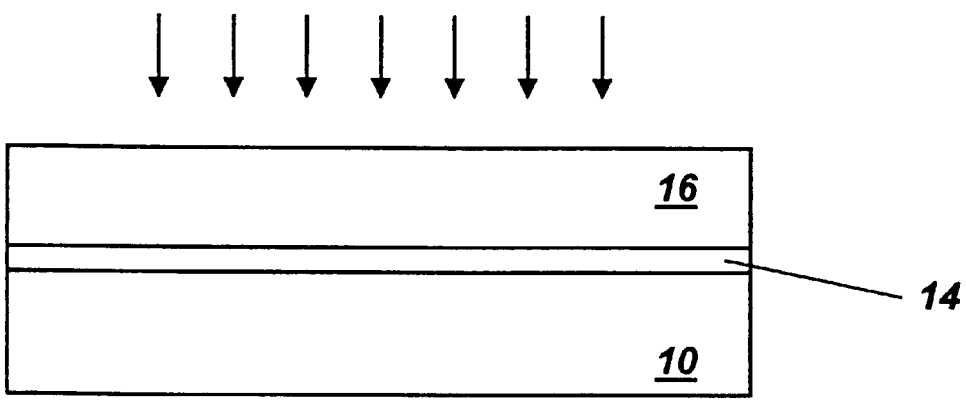
FIG. 2 -- PRIOR ART
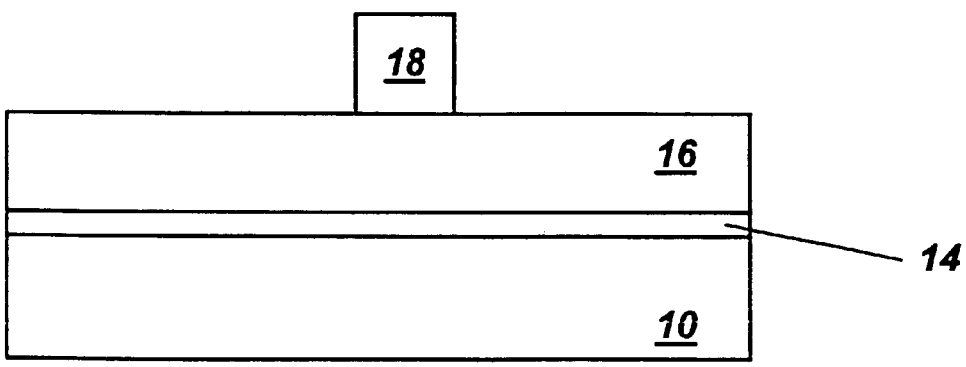
FIG. 3 -- PRIOR ART

FABRICATION OF BURIED CHANNEL DEVICES WITH SHALLOW JUNCTION DEPTH

This is a division of application Ser. No. 08/751,238, Nov. 18, 1996, now U.S. Pat. No. 5,864,163.

This application claims priority from provisional application Serial No. 60/009,053, filed Dec. 27, 1995.

BACKGROUND OF THE INVENTION

1. Field of the Invention

The present invention relates to devices formed on semiconductor regions having doping profiles designed to adjust the operating characteristics of the device, and to the methods of making such devices.

2. Description of the Related Art

When forming MOS devices, it is conventional to form a buried channel by doping the channel region of the MOS device to adjust the threshold of the MOS device. One type of buried channel used in PMOS devices is formed as illustrated in FIGS. 1–3. In FIG. 1, an N-type substrate 10 has a 100–500 Å thick sacrificial oxide layer 12 formed on its surface. The threshold adjust implant is made through the sacrificial oxide into the substrate 10. The threshold adjust implant may, for example, consist of a boron fluoride ($BF_2$) implant at a dosage of $5 \times 10^{11}$ to $1 \times 10^{13}$ per $cm^2$ with an energy of 30–70 KeV. For those device configurations which require an implantation to prevent punchthrough, an antipunchthrough implant is performed next. First, photoresist is deposited and patterned to define the region for the antipunchthrough implant. Then, phosphorus ions are implanted into the substrate at a dosage of $5 \times 10^{11}$ to $1 \times 10^{13}$ per $cm^2$ with an energy of 50–250 KeV. The antipunchthrough implant mask is then removed. Regardless of whether an antipunchthrough implant is made or not, the sacrificial oxide 12 is then removed.

Referring to FIG. 2, a layer of thermal oxide 14 is grown to a thickness of 50–150 Å on the substrate 10 to serve as a gate oxide layer. A layer of polysilicon 16 is deposited to a thickness of 2000–4000 Å, for use in forming the gate of the PMOS device. Phosphorus ions are implanted into the polysilicon layer 16 and then annealed to thermally activate the implanted dopants. If it is desired, a refractory metal or silicide layer such as $WSi_x$ or $TiSi_x$ is then formed on top of the polysilicon to reduce the resistance of the gate electrode material. As shown in FIG. 3, a photoresist layer is deposited on the polysilicon, and other layers if present, and the photoresist is patterned to form a gate mask 18. The polysilicon layer 16 is then etched and processing continues to complete the PMOS device.

CMOS devices consist of a PMOS device and an NMOS device. Performance of both PMOS and NMOS devices typically must be improved to achieve improved CMOS performance. Two problems are of particular concern for improving the performance and reducing the size of MOS devices: the short-channel effect and the segregation of dopants into the gate oxide. It is generally desirable to use a shallow buried channel doping region to avoid the short channel effect, but conventional implantation techniques often have difficulty in reliably producing a suitable channel doping profile. Typically, low energy implantations are used to define a shallow threshold adjust doping profile but such implantations are difficult to control and so are not well suited to mass production. Accordingly, a more readily controlled shallow doping process is desirable.

Conventional attempts to address the segregation of channel dopants into the gate oxide have significant drawbacks. Segregation of dopants from the channel region of the MOS device into the gate oxide may occur during growth of the gate oxide or during other high temperature processes like anneals. To avoid this, low temperature gate oxides are often used in making MOS devices. Such low temperature gate oxides are undesirable because those oxides are of poorer quality and are more prone to pinholes than are oxides grown at higher temperatures. Accordingly, it would be desirable to manufacture MOS devices in a manner compatible with the use of higher temperature gate oxides.

SUMMARY OF THE PREFERRED EMBODIMENTS

In accordance with an aspect of the present invention, a MOS device includes a source, a drain, a gate, a channel region and a gate insulator formed between the channel region and the gate, with the channel region comprising the following regions as a function of depth away from the gate insulator: A first region adjacent the gate insulator is doped with a first dopant of a first conductivity type distributed over a region extending away from the gate insulator, the first dopant having a peak concentration at a depth of less than 0.15 μm. A second region is formed adjacent the first region. The second region is doped with a second dopant of a second conductivity type having a distribution such that a free carrier concentration of the channel region falls from a peak value adjacent the gate insulator to a value at least ten times smaller than the peak value at a distance within 0.15 μm from the gate insulator.

A different aspect of the present invention provides a MOS device having a source, a drain, a gate, a channel and a gate insulator formed between the channel and the gate, with the channel comprising a buried channel region adjacent the gate insulator. The buried channel region is doped with a first dopant of a first conductivity type which acts as a threshold adjust implant for the MOS device, the first dopant having a peak concentration at a depth of less than 0.15 μm. A second region doped with a second dopant of a second conductivity type is formed adjacent the buried channel region. The second dopant has a distribution such that a concentration of dopants of the second conductivity type is equal to a concentration of the first dopant at a distance within 0.15 μm from the gate insulator.

A different aspect of the present invention provides a PMOS device having a gate, a channel region and a gate insulator formed between the channel region and the gate, the channel region comprising a threshold adjust implant distributed over a first region extending away from a surface of the channel region, the threshold adjust implant comprising a first, P-type dopant having a concentration in excess of any other dopant in the first region. A second region doped with a second, N-type dopant is formed adjacent the first region. The second dopant has a distribution such that a concentration of N-type dopants is equal to a concentration of the first, P-type dopant at a depth of 0.03–0.07 μm.

A different aspect of the present invention provides a method of making a MOS device comprising the steps of forming a gate oxide over a substrate, depositing a first polysilicon layer over the gate oxide, implanting a threshold adjust dopant of a first conductivity type through the polysilicon layer, through the gate oxide and into the substrate, depositing a second layer of gate material over the first polysilicon layer, and forming a gate electrode mask and etching the second layer of gate material to form a gate electrode. In accordance with a further aspect of the present invention, this method also includes the following steps performed before the formation of the gate oxide: forming a sacrificial oxide layer on a surface of the substrate; implanting into the substrate a dopant of a second conductivity type; and etching the sacrificial oxide to expose the surface of the substrate.

In accordance with another aspect of the present invention, a method of making a PMOS device comprises the steps of forming a gate oxide over a substrate, depositing a first polysilicon layer over the gate oxide, implanting a P-type threshold adjust dopant through the polysilicon layer, through the gate oxide and into the substrate, depositing a second layer of gate material over the first polysilicon layer, and forming a gate electrode mask and etching the second layer of gate material and the first polysilicon layer to form a gate electrode.

According to the present invention, a PMOS device can be made by forming a gate oxide over a substrate, depositing a first polysilicon layer to a thickness of 300–2500 Å over the gate oxide, implanting boron at a density of $3\times10^{12}$ to $3\times10^{13}$ per $cm^2$ with an energy of 20–200 KeV through the polysilicon layer, through the gate oxide and into the substrate, depositing a second layer of gate material over the first polysilicon layer, and forming a gate electrode mask and etching the second layer of gate material to form a gate electrode.

BRIEF DESCRIPTION OF THE DRAWINGS

FIGS. 1–3 illustrate process steps in the conventional process for making a PMOS device.

DETAILED DESCRIPTION OF THE PREFERRED EMBODIMENTS

In accordance with a preferred embodiment of the present invention, the buried channel region used to adjust the threshold of a MOS device is formed at a reduced depth so as to suppress the short channel effect, in the buried channel MOS device. Other preferred embodiments of the present invention perform a buried channel or a threshold adjust implantation and an antipunchthrough implantation through a thin layer of polysilicon formed over the gate oxide of the device. Because these implants are made through a layer of polysilicon that becomes part of the MOS gate, rather than through the conventional sacrificial oxide layer, the dopants are implanted so that the peak concentrations of the dopants are closer to the surface than are the peak concentrations of comparable dopant regions formed in accordance with conventional processes. Control of the doping profiles formed by the threshold adjust and the antipunchthrough implants is greatly improved through use of this technique. Because the threshold adjust implantation is made after the gate oxide is formed, there is a relatively low dopant concentration in the channel region and little dopant diffusion during growth of the gate oxide. Thus, there will be little or no dopant segregation during growth of the gate oxide, resulting in improved gate oxide quality. Aspects of the present invention allow the use of a wider variety of gate oxide growth techniques than are conventionally available.

Figure 4:
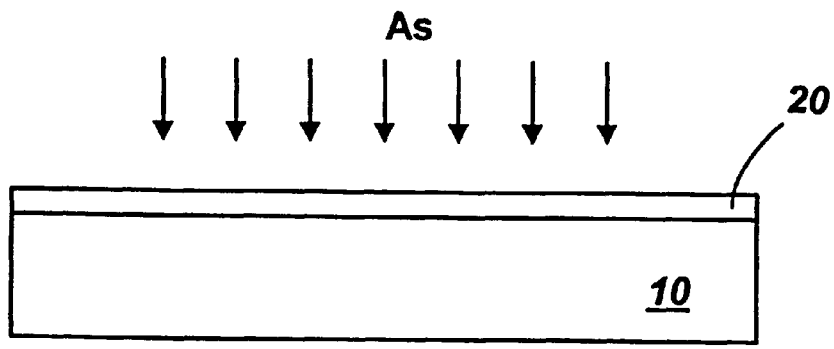
FIGS. 4–6 illustrate process steps for making a PMOS device in accordance with a preferred embodiment of the present invention.

A process flow in accordance with preferred aspects of the present invention is described with reference to FIGS. 4–6. While these embodiments of the present invention are described in terms of the formation of a PMOS device, the process can also be used to form the PMOS section of a CMOS device. Aspects of the invention may also be applied to the formation of NMOS devices having shallow buried channel regions. In the preferred process flow for a PMOS device, a P-type dopant such as boron is implanted to adjust the threshold of the channel region of the PMOS device after the gate oxide of the PMOS device is formed. The depth of the threshold adjust implant may be controlled in some preferred embodiments by performing a second implantation of, for example, an N-type dopant such as arsenic to form a doped region beneath the buried channel region and to form a junction with the threshold adjust implant. The dopant distribution formed by this second implantation, referred to herein as a buried channel stop implant, acts as a lower boundary for the buried channel region formed by the threshold adjust implantation.

It is desirable to form the buried channel stop implant prior to forming the gate oxide. Thus, as illustrated in FIG. 4, a sacrificial oxide 20 is grown to a thickness of 100–500 Å on the surface of an N-type substrate 10 and then a donor dopant is implanted into the substrate 10 through the sacrificial oxide layer 20. The buried channel stop implantation preferably consists of arsenic ions implanted at a dosage of $1\times10^{12}$ to $2\times10^{13}$ per $cm^2$ with an energy of 90–400 KeV to form an arsenic distribution within the substrate having a peak concentration at a depth of 0.03–0.15 µm. Arsenic is a particularly preferred dopant for the buried channel stop implantation because arsenic is comparatively heavy and so is relatively immobile and less likely to diffuse significantly during the growth of the gate oxide. In addition, arsenic implantations tend to have a narrower doping profile, which improves the definition of the boundary of the buried channel region. After the buried channel stop implant is formed, the sacrificial oxide layer is removed, and a layer of oxide 22 is grown on the substrate to a thickness of 50–150 Å to serve as the gate oxide of the PMOS device. The relatively high energy preferably used for the buried channel stop implant creates a dopant distribution displaced from the surface of the channel region. During subsequent annealing steps, relatively few of these deeply implanted impurities will diffuse sufficiently to reach the surface of the channel. Accordingly, the impurities from the buried channel stop implant should be unable to diffuse into the gate oxide during growth of the gate oxide. The present inventors believe that forming the buried channel stop implant prior to growing the gate oxide will not adversely affect the characteristics of the gate oxide and should not affect device performance.

Figure 5:
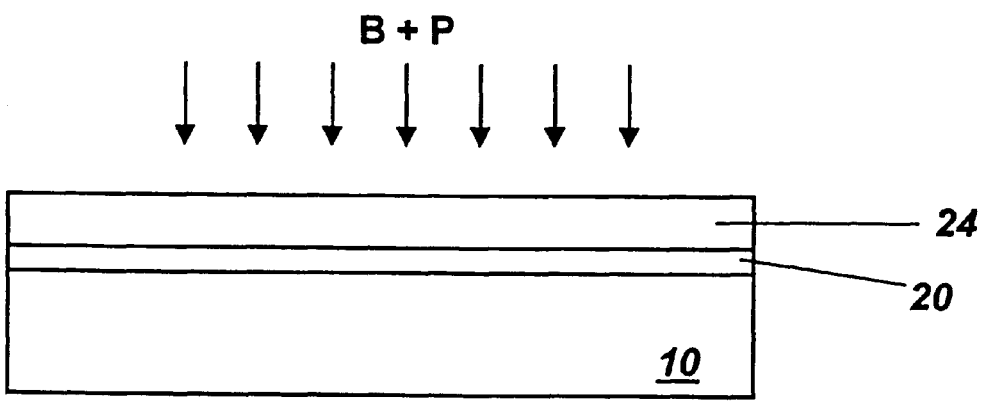

A thin polysilicon layer 24 of approximately 300–2500 Å or, more preferably, 300–1000 Å is deposited over the gate oxide layer 22, as shown in FIG. 5. Both a P-type dopant implantation to adjust the threshold of the PMOS device and an N-type dopant implantation to form an antipunchthrough implant are preferably made through gate oxide layer 22 and the polysilicon layer 24. Boron is implanted at a dosage of $1\times10^{12}$ to $5\times10^{13}$ per $cm^2$ or, more preferably, $3\times10^{12}$ to $1\times10^{13}$ per $cm^2$ with an energy of 20–200 KeV or, more preferably, 20–50 KeV to form the threshold adjust implant in a preferred embodiment of the invention. The threshold adjust implant has a boron distribution with a peak concentration at a depth of 0.03–0.06 µm below the surface of the substrate 10. Preferably, the distribution of dopants from the threshold adjust implantation overlaps the distribution of dopants from the earlier formed buried channel stop implant so that the buried channel is limited to a shallow region adjacent the surface of the substrate. This may be accomplished in part by adjusting the energy at which the threshold adjust ions are implanted so that the peak of the dopant distribution of the threshold adjust implant is at the desired position. Forming the buried channel region in this manner, with the implantation of ions subsequent to forming part of the gate, provides two primary advantages for preferred embodiments of the present invention. First, because the implantation is made after the formation of the layer of gate conductor and after the formation of the gate oxide, there is less likelihood of the implanted dopant segregating during the rest of the processing. Second, the implantation through the polysilicon layer allows the implanted dopant to have a distribution nearer the surface of the substrate.

Next, an antipunchthrough implant is formed. An appropriate antipunchthrough implantation may consist of phosphorus ions implanted at a dosage of $3 \times 10^{12}$ to $8 \times 10^{12}$ per cm$^2$ with an energy of 100–200 KeV. Phosphorus implanted in this manner will have a fairly broad distribution within the substrate, with a peak concentration at a depth of 0.1–0.2 μm.

Figure 6:
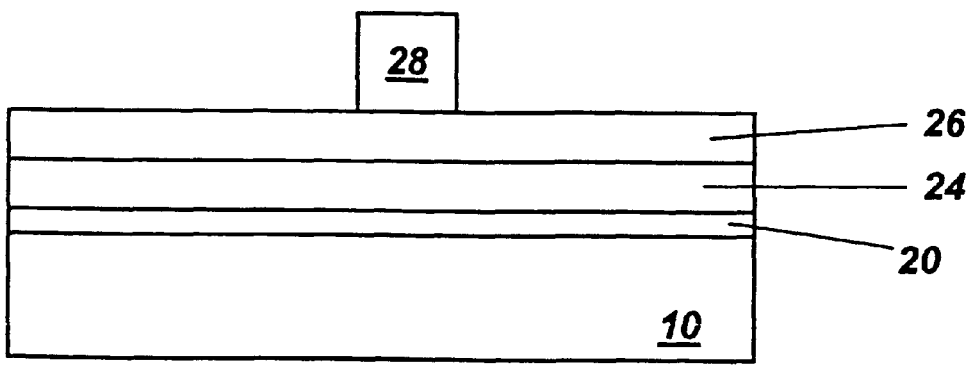

After the threshold adjust implantation and the antipunchthrough implantation, the thin polysilicon layer 24 is preferably left in place to form part of the gate electrode, as shown in FIG. 6. In this preferred implementation, a second polysilicon layer 26 is then deposited to a thickness of approximately 1000–2500 Å on the thin polysilicon layer 22. Alternately, other gate materials might be deposited on the surface of the first polysilicon layer to form part of a multi-layer gate electrode. If it is desired, a refractory metal or silicide layer, such as WSi$_x$ or TiSi$_x$, can be formed on top of the first polysilicon layer to reduce the resistance of the gate electrode material. Alternately, the second layer of gate material might consist of another thin layer of doped polysilicon and a layer of conductive material. Incorporating the first polysilicon layer 24 in the gate electrode material is preferred because it simplifies processing and because it protects the gate oxide. It may nevertheless, under some circumstances, be preferable to remove the thin polysilicon layer 22 and deposit a new polysilicon layer (or other gate material) which has not been subjected to the threshold adjust and antipunchthrough implantations. For such an embodiment, a thicker layer of polysilicon (or other gate material) would be deposited. In either case, the gate material is doped to form a gate electrode. For the illustrated PMOS process, phosphorus ions are preferably implanted into the polysilicon layer 24 and the device is annealed to activate the phosphorus implantation so that the gate electrode layer 24 is N$^+$ doped. If a tungsten polycide gate electrode is desired, a layer of tungsten silicide is preferably formed after the gate electrode 24 is annealed.

Subsequent processing follows conventional PMOS or CMOS process flows. For example, a layer of photoresist would subsequently be deposited and patterned to form a mask 28 as part of the photolithography steps for forming the gate electrode from the polysilicon layers 24 and 26. Other process steps familiar to those of ordinary skill in the art are performed to complete the manufacture of the device.

Figure 7:
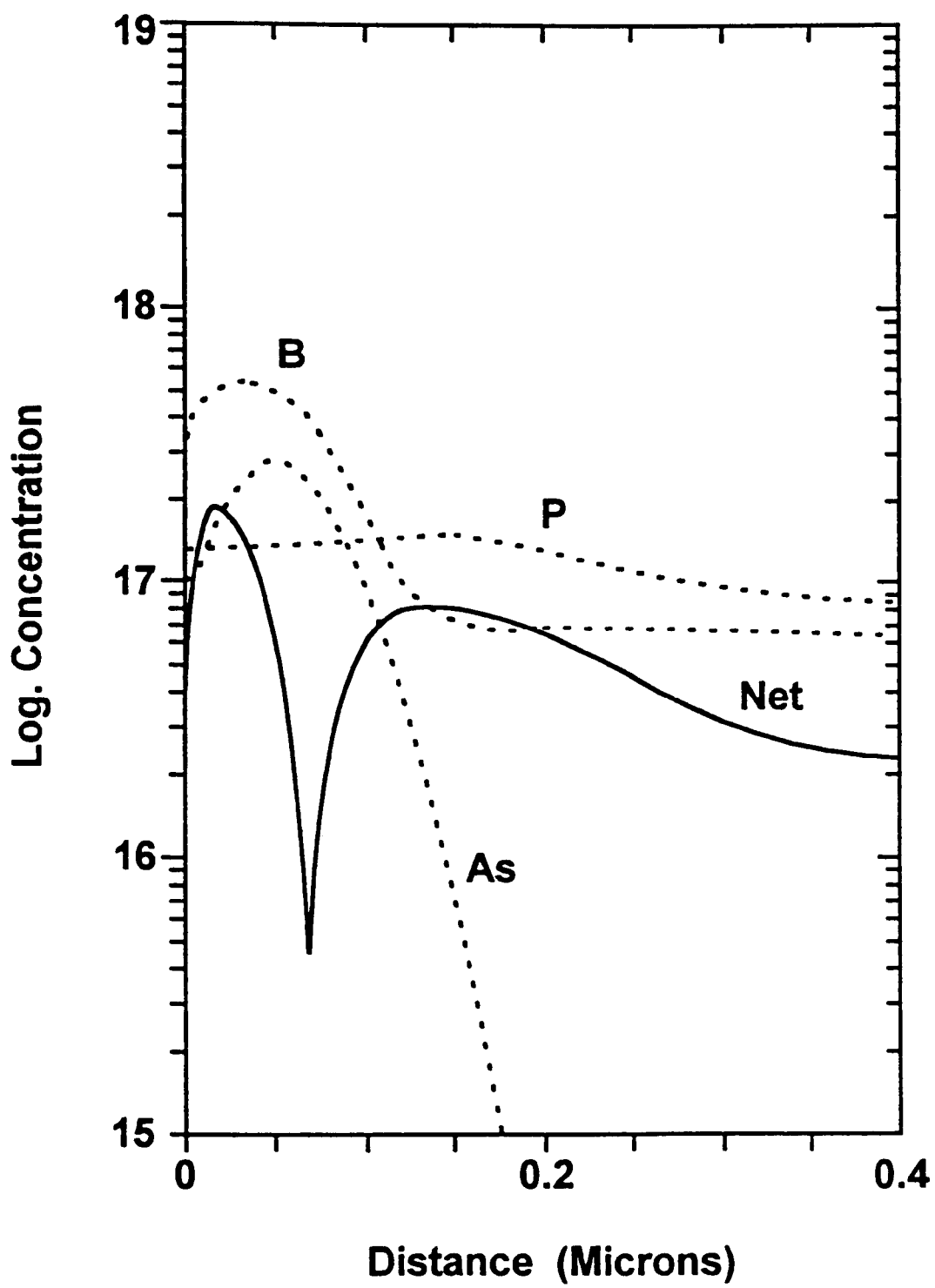
FIG. 7 illustrates the carrier concentration as a function of depth for the channel region of a PMOS device in accordance with a preferred embodiment of the present invention.

FIG. 7 illustrates the calculated channel doping profile (concentration as a function of depth) for a PMOS field effect transistor formed in accordance with the present invention, with the vertical axis indicating the logarithmic concentration of dopants and the horizontal axis indicating the depth away from the surface of the substrate. To generate the illustrated channel doping profile, boron ions are implanted through an 800 Å polysilicon film as a threshold adjust implantation. As illustrated, the peak of the boron threshold adjust implantation is at approximately 0.03 μm. The arsenic buried channel stop implantation has a peak concentration at approximately 0.06 μm; the arsenic dopants compensate the boron and phosphorus dopants so that the free carrier population peaks very near the surface of the substrate and then drops rapidly for depths approaching 0.05 μm. Consequently, the buried channel region for the FIG. 7 transistor is quite shallow and localized near the surface of the channel region.

Figure 8:
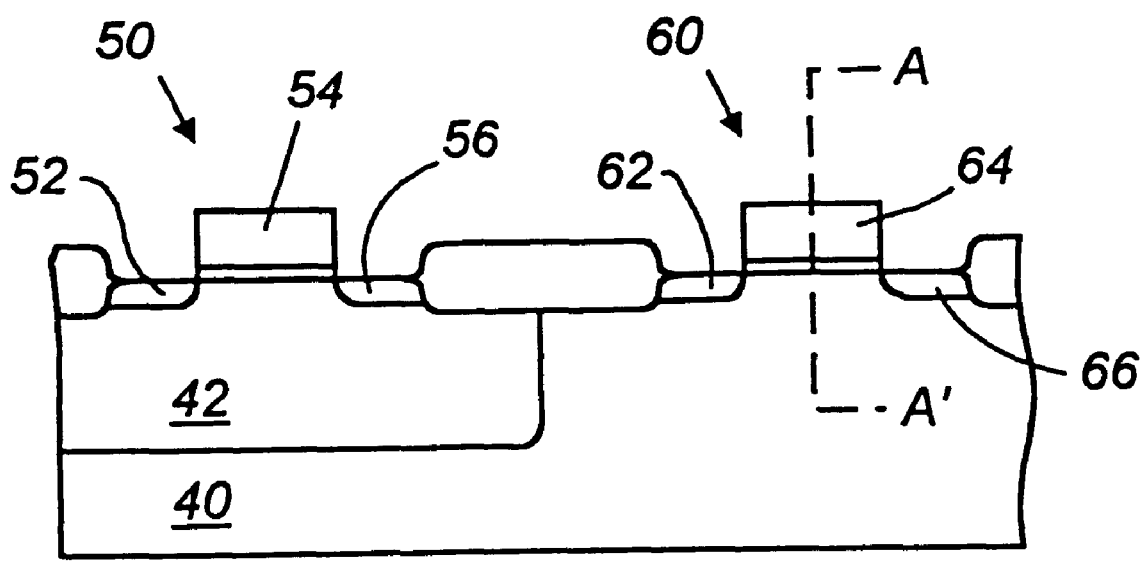
FIG. 8 illustrates a CMOS device in accordance with a preferred embodiment of the present invention.

FIG. 8 illustrates a CMOS device incorporating an NMOS field effect transistor and a PMOS field effect transistor (FET) having a buried channel region formed in accordance with the present invention. An NMOS FET 50 having a source 52, gate 54 and drain 56 is formed in a P-well region 42 on the N-type surface of a silicon substrate 40. Of course, additional wells or surface layers, or alternate well configurations not illustrated, might be formed in other embodiments of the invention to form different types of CMOS devices. A field oxidation 58 separates the NMOS FET 50 from the PMOS FET 60, which consists of a P-type drain 62, gate 64 and P-type source 66. Although it is not clearly shown in FIG. 8, the gate 64 of the PMOS FET 60 preferably consists of a lower, thin polysilicon layer through which the channel doping implants were made and a subsequently deposited upper layer of polysilicon. Such a structure is shown in FIG. 5. An additional layer of a refractory metal or a silicide such as tungsten silicide might also be deposited on the upper polysilicon layer to further reduce the resistance of the gate material or the upper layer of polysilicon might be replaced by a layer of a refractory metal or a silicide. The channel doping profile along the line A–A' is preferably as illustrated in FIG. 7. Use of such a channel doping profile will improve the performance of the PMOS FET and thereby the CMOS device illustrated in FIG. 8.

While preferred embodiments have been specifically described with reference to PMOS devices, aspects of the present invention can readily be applied to the formation of buried channel regions in NMOS devices. An NMOS device may be formed in a P-type region in a substrate, with diffused N$^+$ source and drain regions defining the channel region of the device. The buried channel region for such an NMOS device might consist of a shallow region doped N-type extending across the device's channel region from the N$^+$ source to the N$^+$ drain region. For an NMOS device, the threshold adjust implantation consists of phosphorus or arsenic and the buried channel stop implantation consists of boron. As with the PMOS embodiment, the depth of the threshold adjust implantation and the buried channel stop implantation are preferably adjusted so that the buried channel region is localized near the surface of the channel region.

In particularly preferred embodiments, both the threshold adjust implantation and the buried channel stop implantation for the NMOS device are performed through the gate material. This is because the boron used to form the buried channel stop diffuses readily and could diffuse through the threshold adjust region or even into the gate oxide if the boron implantation were performed before the growth of the gate oxide. Typically, the gate for an NMOS device consists of polysilicon doped heavily P-type, but the gate might alternately be a metal having an appropriate work function with respect to the channel region, such as tungsten. If the NMOS gate is formed from polysilicon, then two layers of polysilicon can be utilized in a manner similar to that used in forming the PMOS embodiment. In particular, a thin layer of polysilicon is formed above the channel region and over the gate oxide so that the threshold adjust implantation and the buried channel stop implantations are made through the thin layer of polysilicon and the gate oxide. A second layer of polysilicon is then deposited, doped and (along with other conductive layers, if desired) patterned to complete the gate electrode. A similar, two-layer strategy may be used if a metal gate is to be used for the NMOS device. A thin layer of metal is formed over the channel region and the gate oxide to a thickness sufficient to protect the gate oxide, but sufficiently thin to allow for the implantation of ions through the gate. After the desired implantation steps are complete, a second metal layer may then be formed.

Although the present invention has been described in terms of certain preferred embodiments, it is to be understood that the scope of the present invention is not limited to the specific embodiments described herein. Accordingly, the scope of the present invention is to be determined from the following claims.

What is claimed:

1. A method of making a MOS device, comprising the steps of:

forming a gate oxide over a substrate;

depositing a first polysilicon layer over the gate oxide so as to have an entire upper surface exposed;

after said forming the gate oxide layer and depositing the first polysilicon layer, and with the entire upper surface of the first polysilicon layer exposed, implanting a threshold adjust dopant of a first conductivity type through the entire upper surface of the first polysilicon layer, through the gate oxide and into the substrate;

depositing a second layer of gate material over the first polysilicon layer; and forming a gate electrode by photolithography, including forming a gate electrode mask above the second layer of gate material and etching the second layer of gate material to form the gate electrode.

2. The method of claim 1, further comprising the following steps performed before the formation of the gate oxide:

forming a sacrificial oxide layer on a surface of the substrate;

implanting into the substrate a dopant of a second conductivity type, so as to overlap with the implanted dopant of first conductivity type.

3. A method of making a PMOS device, comprising the steps of:

forming a gate oxide over a substrate;

depositing a first polysilicon layer over the gate oxide;

implanting a P-type threshold adjust dopant through the first polysilicon layer, through the gate oxide and into the substrate, immediately after said depositing the first polysilicon layer;

depositing a second polysilicon layer abutting and above the entire surface of the first polysilicon layer; and forming a gate electrode by photolithography, including forming a gate electrode mask above the second polysilicon layer to pattern the second polysilicon layer and the first polysilicon layer.

4. The method of claim 3, further comprising the following steps performed before the formation of the gate oxide:

forming a sacrificial oxide layer on a surface of the substrate;

implanting into the substrate an N-type dopant, such that the N-type dopant and the P-type dopant overlap each other.

5. The method of claim 3, wherein the threshold adjust implantation is made so as to have a peak concentration at a depth of between 0.03–0.06 $\mu$m.

6. The method of claim 4, wherein the threshold adjust implantation is made so as to have a peak concentration at a depth of between 0.03–0.06 $\mu$m and wherein the N-type dopant has a peak concentration at a depth between 0.06–0.15 $\mu$m.

7. The method of claim 6, wherein the threshold adjust dopant comprises boron.

8. The method of claim 7, wherein the N-dopant is arsenic.

9. The method of claim 3, further comprising the step of implanting into the substrate an N-type dopant having a distribution overlapping the P-type threshold adjust implant, so as to form a buried channel region having a depth of less than 0.1 $\mu$m.

10. A method of making a PMOS device, comprising the steps of:

forming a gate oxide over a substrate;

depositing a first polysilicon layer to a thickness of 300–2500 Å over the gate oxide;

implanting boron at a density of $3\times10^{12}$ to $1\times10^{13}$ per cm$^2$ with an energy of 20–200 KeV through the polysilicon layer, through the gate oxide and into the substrate, immediately after said depositing a first polysilicon layer;

depositing a second layer of gate material abutting and above the first polysilicon layer; and forming a gate electrode by photolithography, including patterning the second layer of gate material and the first polysilicon layer, to form the gate electrode.

11. The method of claim 10, further comprising the step of implanting into the substrate an N-type dopant having a distribution overlapping the boron implant, so as to form a buried channel region having a depth of less than 0.1 $\mu$m.

12. The method of claim 10, further comprising the following steps performed before the formation of the gate oxide:

forming a sacrificial oxide layer on a surface of the substrate;

implanting into the substrate through the sacrificial oxide layer an N-type dopant having a peak concentration at an energy of 90–400 KeV; and etching the sacrificial oxide to expose the surface of the substrate.

13. The method of claim 11, further comprising the step of implanting into the substrate through the first polysilicon layer to form an antipunchthrough implant.

14. The method of claim 13, wherein the antipunchthrough dopant comprises phosphorus implanted at a density of $3\times10^{12}$ to $8\times10^{12}$ per cm$^2$ with an energy of 100–200 KeV.

* * * * *